(12) United States Patent
Lee

(10) Patent No.: US 9,735,346 B2
(45) Date of Patent: Aug. 15, 2017

(54) ELECTRONIC DEVICE AND METHOD FOR FABRICATING THE SAME

(71) Applicant: SK hynix Inc., Icheon-Si (KR)

(72) Inventor: Hyung-Suk Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/048,064

(22) Filed: Feb. 19, 2016

(65) Prior Publication Data

US 2017/0033279 A1    Feb. 2, 2017

(30) Foreign Application Priority Data

Jul. 27, 2015  (KR) .................. 10-2015-0105860

(51) Int. Cl.
*H01L 43/08* (2006.01)
*H01L 43/12* (2006.01)
*H01L 43/02* (2006.01)
*H01L 45/00* (2006.01)

(52) U.S. Cl.
CPC .............. *H01L 43/08* (2013.01); *H01L 43/02* (2013.01); *H01L 43/12* (2013.01); *H01L 45/06* (2013.01); *H01L 45/141* (2013.01); *H01L 45/16* (2013.01)

(58) Field of Classification Search
CPC ......... H01L 43/08; H01L 43/02; H01L 43/12; H01L 45/06; H01L 45/141; H01L 45/16
See application file for complete search history.

(56) References Cited

U.S. PATENT DOCUMENTS

| | | | | |
|---|---|---|---|---|
| 2014/0131786 A1* | 5/2014 | Ryu | ................. | H01L 27/10876 257/316 |
| 2014/0264680 A1* | 9/2014 | Kim | .................... | H01L 27/222 257/427 |
| 2015/0061054 A1* | 3/2015 | Kim | ....................... | H01L 43/08 257/421 |
| 2015/0311253 A1* | 10/2015 | Choi | .................... | H01L 27/228 257/252 |
| 2016/0141367 A1* | 5/2016 | Lee | ..................... | H01L 29/1033 257/368 |

FOREIGN PATENT DOCUMENTS

| KR | 10-2004-0099617 A | 12/2004 |
|---|---|---|
| KR | 10-0990145 B1 | 10/2010 |

* cited by examiner

*Primary Examiner* — Fernando L Toledo
*Assistant Examiner* — Neil Prasad
(74) *Attorney, Agent, or Firm* — Perkins Coie LLP

(57) ABSTRACT

An electronic device may include a semiconductor memory. The semiconductor memory may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. According to the implementations, the characteristics of the variable resistance element can be improved.

17 Claims, 6 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2015-0105860, entitled "ELECTRONIC DEVICE AND METHOD FOR FABRICATING THE SAME" and filed on Jul. 27, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the characteristics of a variable resistance element can be improved.

In an implementation, a method for fabricating an electronic device including a semiconductor memory device is provided. The method may include: forming a plurality of buried gates in a substrate including a first region and a second region, wherein a distance between adjacent buried gates is greater in the second region than in the first region; forming an ion implantation barrier layer over the substrate in the second region; forming a junction by performing ion implantation into the substrate between the adjacent buried gates in the first and second regions; removing the ion implantation barrier layer; forming an interlayer insulating layer over the substrate in the first and second regions; forming a lower electrode contact through the interlayer insulating layer in the first region so as to contact the substrate; and forming a variable resistance element over the interlayer insulating layer in the first region so as to be connected to the lower electrode contact.

The first region comprises a cell region, and the second region comprises a peripheral region. The ion implantation barrier layer comprises a dielectric material. The ion implantation barrier layer comprises oxide. The method may further comprise before the forming of the ion implantation barrier layer over the substrate in the second region, etching the substrate to a predetermined depth. the forming of the ion implantation barrier layer over the substrate in the second region comprises: forming the ion implantation barrier layer over the substrate in the first and second regions; forming a mask pattern over the ion implantation barrier layer in the second region; removing the ion implantation barrier layer from the first region; and removing the mask pattern. The removing of the ion implantation barrier layer is performed by wet cleaning. The forming of the junction comprises performing the ion implantation using an N-type dopant. The forming of the junction comprises performing the ion implantation using a dopant comprising arsenic (As) or phosphorus (P). The variable resistance element comprises a single-layer or a multi-layer structure. The variable resistance element comprises metal oxides including transition metal oxide and perovskite-based oxide, phase-change materials including chalcogenide-based materials, ferroelectric materials, or ferromagnetic materials, or the combination of thereof. Each of the buried gates comprises a metal gate and a sealing layer. The sealing layer comprises nitride. In some implementations, the first region comprises a cell region, and the second region comprises a peripheral region. In some implementations, the ion implantation barrier layer comprises a dielectric material. In some implementations, the ion implantation barrier layer comprises oxide. In some implementations, the method may further comprise before the forming of the ion implantation barrier layer over the substrate in the second region, etching the substrate to a predetermined depth. In some implementations, the forming of the ion implantation barrier layer over the substrate in the second region comprises: forming the ion implantation barrier layer over the substrate in the first and second regions; forming a mask pattern over the ion implantation barrier layer in the second region; removing the ion implantation barrier layer from the first region; and removing the mask pattern. In some implementations, the removing of the ion implantation barrier layer is performed by wet cleaning. In some implementations, the forming of the junction comprises performing the ion implantation using an N-type dopant. In some implementations, the forming of the junction comprises performing the ion implantation using a dopant comprising arsenic (As) or phosphorus (P). In some implementations, the variable resistance element comprises a single-layer or a multi-layer structure. In some implementations, the variable resistance element comprises metal oxides including transition metal oxide and perovskite-based oxide, phase-change materials including chalcogenide-based materials, ferroelectric materials, or ferromagnetic materials, or the combination of thereof. In some implementations, each of the buried gates comprises a metal gate and a sealing layer. In some implementations, the sealing layer comprises nitride.

In another aspect, an implementation, an electronic device is provided to may include a semiconductor memory. The semiconductor memory may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region.

In some implementations, the buried gates in the second region are further distant from one another than the buried gates in the first region. In some implementations, the variable resistance element includes two magnetic layers and a tunnel barrier layer interposed between the two magnetic layers. In some implementations, the electronic device may further comprise a first wiring electrically connected to the variable resistance element; and a second wiring electrically connected to the second junction region. In some implementations, the variable resistance element switches between two different resistance states according to a voltage or current applied to the variable resistance element. In some implementations, the first region comprises a cell region, and the second region comprises a peripheral region.

DETAILED DESCRIPTION

Figure 1A:
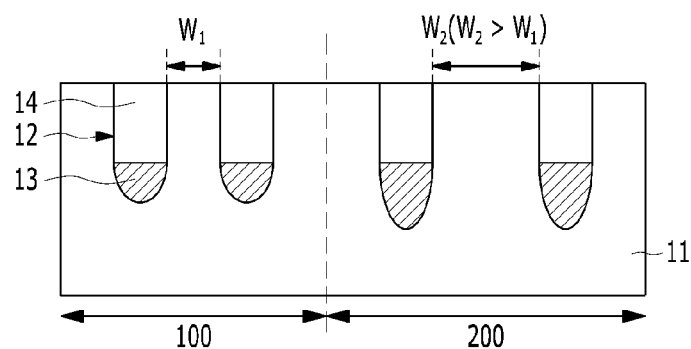
FIGS. 1A through 1E are cross-sectional views illustrating an exemplary semiconductor device according to an implementation of the disclosed technology, and a method for fabricating the same.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1A through 1E are cross-sectional views illustrating a semiconductor device according to an implementation of the disclosed technology, and a method for fabricating the same.

As shown in FIG. 1A, a semiconductor device according to an implementation of the disclosed technology may be provided with a substrate 11 including a first region 100 and a second region 200. The first region 100 may include a cell region, and the second region 200 may include a peripheral region. The substrate 11 may include a semiconductor substrate. The cell region may include a plurality of memory cells in which data writing and erasing operations, etc., are performed, and select transistors, and the peripheral region may include a plurality of high-voltage and low-voltage transistors configured to control operation of the cell region. The pattern density of the cell region may be higher than the pattern density of the peripheral region, because the plurality of memory cells configured to store date are densely arranged. On the contrary, because the transistors of the peripheral region serve to apply a voltage, the width of the transistors may be larger than that of the memory cells, and the distance between the transistors may also be larger than the distance between the memory cells.

Next, trenches 12 and 12A may be formed in the first region 100 and second region 200 of the substrate 11, respectively. The trenches 12 and 12A may provide regions for forming switching elements 13 and buried gates 13A in the first region 100 and the second region 200, respectively. The trenches 12 and 12A may be formed to have different line widths and depths due to the difference in etch rate between the first region 100 and second region 200 of the substrate 11, which results from the difference in trench density therebetween. In other words, the trenches of the first region 100, which have a relatively high density, may be formed to have a narrower line width, a shallower depth and a narrower spacing ($W_2 > W_1$) compared to the trenches of the second region 200.

Next, switching elements 13 and buried gates 13A, which fill portions of trenches 12 and 12A, respectively, may be formed. Although not shown in the figures, a liner-type insulating layer (not shown) may be formed along the surface of the trenches 12 and 12A, before the switching elements 13 and the buried gates 13A are formed.

Thereafter, a sealing layer 14 that fill the remaining portions of the trenches 12 and 12A may be formed on the switching elements 13 and the buried gates 13A. The sealing layer 14 may serve to provide insulation between the switching element 13 and buried gate 13A and a layer formed above the switching element 13 and the buried gate 13A. The switching element 13 and the buried gate 13 may include an electrically conductive material, and the sealing layer 14 may include a dielectric material, for example, nitride.

The switching elements 13 of the first region 100 may include a transistor configured to select a specific unit cell in the semiconductor device having the plurality of unit cells. One end of each of the switching elements 13 may be electrically connected to a lower electrode contact to be formed in a subsequent process, and the other end may be electrically connected to a source line through a source line contact (not shown). The buried gates 13A of the first region 100 can function as transistors to drive or control the first switching elements 13 of the first region 1.

Although not shown in the figures, the first and second regions 100 and 200 of the substrate 11 may then be etched to a predetermined depth. Thus, a portion of each of the switching elements 13 and 14 may protrude above the substrate 11. On a stepped portion between each of the switching elements 13 and the substrate 11, a landing plug may be formed by a subsequent process.

Figure 1B:
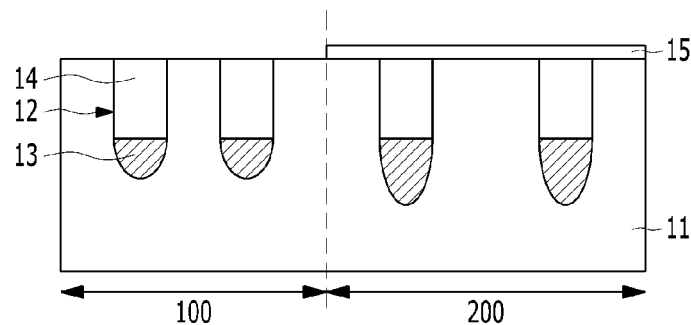

As shown in FIG. 1B, an ion implantation barrier layer 15 may be formed over or on the substrate 11 in the second region 200. The process of forming the ion implantation barrier layer 15 may be performed by a series of processes including forming the ion implantation barrier layer 15 on the substrate 11, forming a mask pattern (not shown) on the ion implantation barrier layer 15 in the second region 200, and then selectively removing the ion implantation barrier layer from the first region 100 using the mask pattern as an etch barrier.

The ion implantation barrier layer 15 can serve to control the ion implantation depth that changes depending on the pattern density of the first region 100 and the second region 200 in a subsequent junction ion implantation process. The ion implantation barrier layer 15 may include a dielectric material, and may be formed of or include a material which is easily removed. The ion implantation barrier layer 15 may include, for example, oxide. The thickness of the ion implantation barrier layer 15 may be controlled as desired depending on the pattern density of the first region 100 and the second region 200.

Figure 1C:
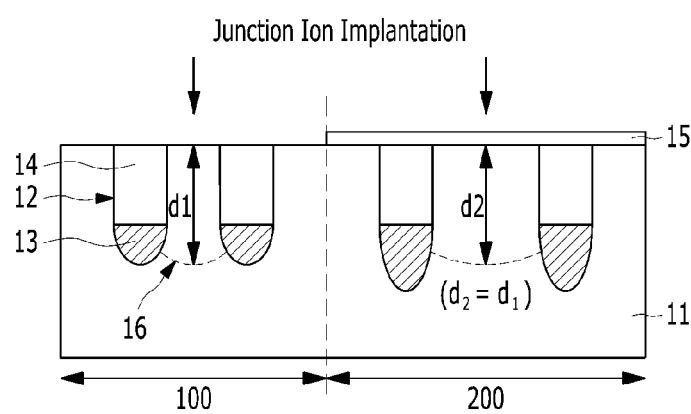

As shown in FIG. 1C, junction ions may be implanted into the substrate 11 between the switching elements 13 and the buried gates 13A in each of the first and second regions 100 and 200. As a result, doped regions 16 may be formed between the switching elements 13 and the buried gates 13A. The doped regions 16 can serve as drains for the transistors. Junction ion implantation for forming the doped regions 16 may be performed using an N-type dopant. Examples of the N-type dopant include dopants such as arsenic (As) or phosphorus (P).

Particularly, in this implementation, doped regions 16 having the same depth ($d_1=d_2$) can be formed in the first region 100 and the second region 200 by previously forming the ion implantation barrier layer 15 in the second region 200 in which the distance between patterns (e.g., buried gates 13A) is relatively large, as shown in FIG. 1B. In other words, the failure of threshold voltage (Vt) control can be prevented by preventing a deep junction from being formed in the second region 200 in which the distance between patterns is relatively large.

Figure 1D:
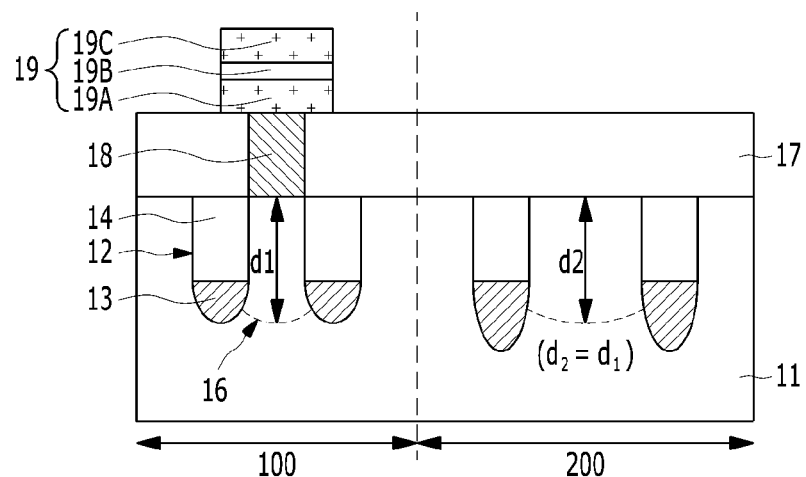

As shown in FIG. 1D, a first interlayer insulating layer 17 may be formed on the substrate 11 including the first and second regions 100 and 200. The first interlayer insulating layer 17 may include any single layer selected from or including an oxide layer, a nitride layer or an oxynitride layer, or a stack of two or more of these layers.

Next, a lower electrode contact 18 may be formed through the first interlayer insulating layer 17 so as to contact the substrate 11. The lower electrode contact 18 serves as a channel through which a voltage or current is supplied from a portion below a variable resistance element 19 to the variable resistance element 19. The lower electrode contact 18 may include various electrically conductive materials, for examples, metals, metal nitrides, etc. The lower electrode contact 18 can be formed by a series of processes including forming a contact hole through the first interlayer insulating layer 17 so as to expose the substrate 11, and then depositing an electrically conductive material on the entire surface so as to gap-fill the contact hole, and performing an isolation process to provide electrical isolation between the adjacent lower electrode contacts 18. The isolation process can be performed by etching (or polishing) the electrically conductive material, deposited on the entire surface, using a blanket etching (e.g., etch back) or chemical mechanical polishing process, until the first interlayer insulating layer 17 is exposed.

Next, a variable resistance element 19 may be formed on the first interlayer insulating layer 17 so as to contact the lower electrode contact 28. Although the variable resistance element 19 is shown to have a line width greater than that of the lower electrode contact 18, the line width of the variable resistance element 19 can, if necessary, be controlled to be smaller than or equal to that of the lower electrode contact 18. The variable resistance element 19 may further include electrodes (not shown) at the top and bottom thereof. The variable resistance element 19 may have a characteristic in which the variable resistance element 19 switches between different resistance states (or different resistance values) in response to a bias (for example, voltage or current) that is applied through the top electrode and/or the bottom electrode. Such a characteristic may be used in various fields. For example, the variable resistance element 19 may be used as data storage for storing data.

The variable resistance element 19 can show a variable resistance characteristic in response to a bias applied through the upper electrode or the lower electrode. The variable resistance element 19 may include a single-layer or multi-layer structure. The variable resistance element 19 may include various materials that are used in, for example, RRAM, PRAM, FRAM, MRAM, etc. For example, the variable resistance element 19 may include phase-change materials. The phase-change materials may include a chalcogen compound. The phase-change materials have a crystalline state that changes to an amorphous state or a crystal state in response to an external stimulus (for example, voltage or current), and may have a characteristic in which the phase change materials switch between different resistance states. Furthermore, the variable resistance element 19 may include metal oxide. The metal oxide may include transition metal oxide (TMO) or perovskite-based oxide or the like. The metal oxide includes vacancies in the film and may have a characteristic in which the metal oxide switches between different resistance states depending on the creation and distinction of a conductive path according to the behavior of the vacancies in response to an external stimulus.

Furthermore, the variable resistance element 19 may include stacked layers in which a tunnel barrier layer 19B is interposed between two magnetic material layers 19A and 19C. The stacked structure having the tunnel barrier layer interposed between the two magnetic material layers is also called a magnetic tunnel junction (MTJ). If the two magnetic material layers 19A and 19C have the same magnetization direction (or have parallel magnetization directions), the two magnetic material layers may have a low-resistance state. If the two magnetic material layers have different magnetization directions (or do not have parallel magnetization directions), the two magnetic material layers may have a high-resistance state. However, this implementation is not limited thereto, and any material satisfying a variable resistance characteristic capable of switching between different resistance states in response to an external stimulus may be used for the variable resistance element 19.

Next, a spacer (not shown) may be formed on the sidewall of the variable resistance element 19.

Figure 1E:
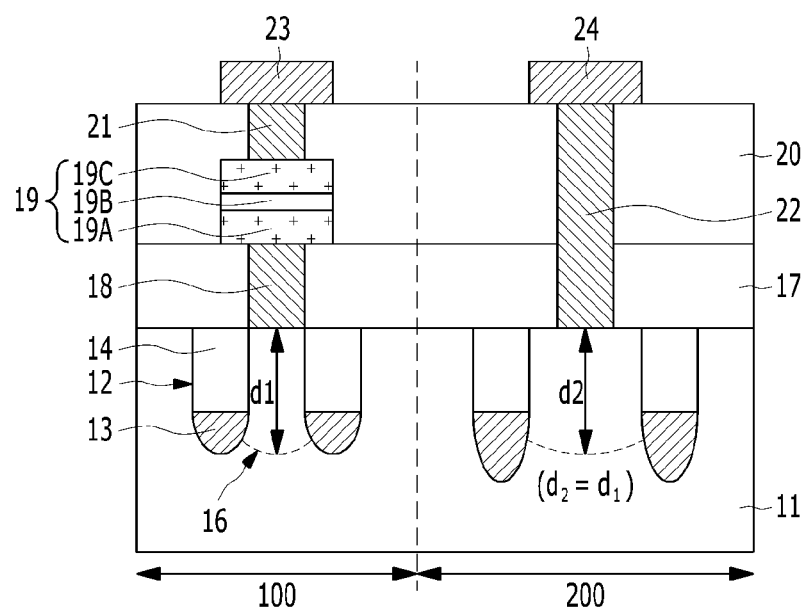

As shown in FIG. 1E, a second interlayer insulating layer 20 may be formed on the first interlayer insulating layer 17 in the first and second regions 100 and 200. The second interlayer insulating layer 20 may be formed to a thickness sufficient to fill between the variable resistance elements 19. For example, the second interlayer insulating layer 20 may be formed by taking into consideration the height of the upper electrode contact so as to have a level higher than the top surface of the variable resistance element 19. The second interlayer insulating layer 20 may be formed of or include, for example, any single layer selected from the group consisting of or including an oxide layer, a nitride layer, or an oxynitride layer, or a stack of two or more of these layers.

Next, an upper electrode contact 21 may be formed through the second interlayer insulating layer 20 on the variable resistance element 19 so as to be connected to the variable resistance element 19. The upper electrode contact 21 may be formed by etching the second interlayer insulating layer 20 so as to expose the top of the variable resistance element 19 to thereby form a contact hole, and filling an electrically conductive material in the contact hole. The upper electrode contact 21 can serve to provide an electrical connection between a first metal wiring 23 to be formed in a subsequent process and the variable resistance element 19 and, at the same time, can serve as an electrode for the variable resistance element 19. The upper electrode contact 21 may be formed of or include the same material as the lower electrode contact 18.

Next, a contact plug 22 may be formed through the first and second interlayer insulating layers 17 and 20 in the second region 200 so as to be connected to the substrate 11. The contact plug 22 can serve to provide an electrical connection between a second metal wiring 24 to be formed in a subsequent process and the underlying structure. In this implementation, the first and second interlayer insulating layers 17 and 20 are etched at the same time to form the contact plug 22, but is not limited thereto, and the etching process may also be performed separately for the portion passing through the first interlayer insulating layer 17 and the portion passing through the second interlayer insulating layer 20.

Next, a first metal wiring 23 that is connected to the upper electrode contact 21 in the first region 100 and a second metal wiring 24 that is connected to the contact plug 22 in the second region 200 may be respectively formed. The first and second metal wirings 23 and 24 may include a metal layer. The metal layer means an electrically conductive layer including a metal element, and may include a metal layer, a metal oxide layer, a metal nitride layer, a metal oxynitride layer, a metal silicide layer or the like.

In this implementation, the first metal wiring 23 and the second metal wiring 24 are shown at the same level, but are not limited thereto, and may be formed at different levels depending on the process, and the processes for forming the contact plug 22 and the second metal wiring 24 may also be performed after formation of the first metal wiring 23.

As described above, in this implementation, the ion implantation barrier layer 15 is previously formed in the second region 200 in which the distance between the patterns is relatively large, as shown in FIG. 1B. Then, the junction ion implantation is performed as shown in FIG. 1C for the second region 200 including the implantation barrier layer 15. As a result, formation of a deep junction in the second region 200 can be prevented, and thus failure of threshold voltage control can be prevented.

As described above, according to the method for fabricating an electronic device including a semiconductor memory device according to the implementations of the disclosed technology, the characteristics of the variable resistance element can be improved.

The above and other memory circuits or semiconductor devices based on the disclosed technology can be used in a range of devices or systems. FIGS. 2-6 provide some examples of devices or systems that can implement the memory circuits disclosed herein.

Figure 2:
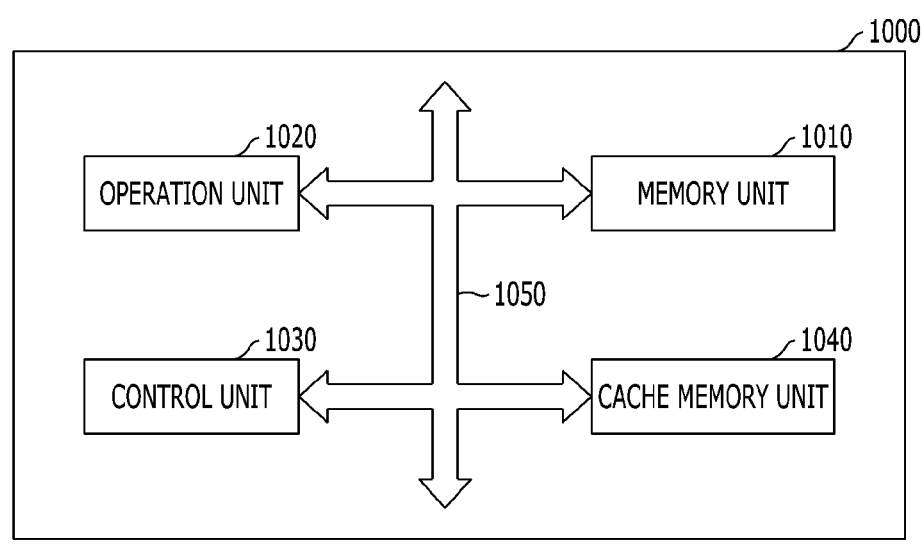
FIG. 2 is an example of configuration diagram of a microprocessor implementing memory circuitry based on the disclosed technology.

FIG. 2 is an example of configuration diagram of a microprocessor implementing memory circuitry based on the disclosed technology.

Referring to FIG. 2, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 3:
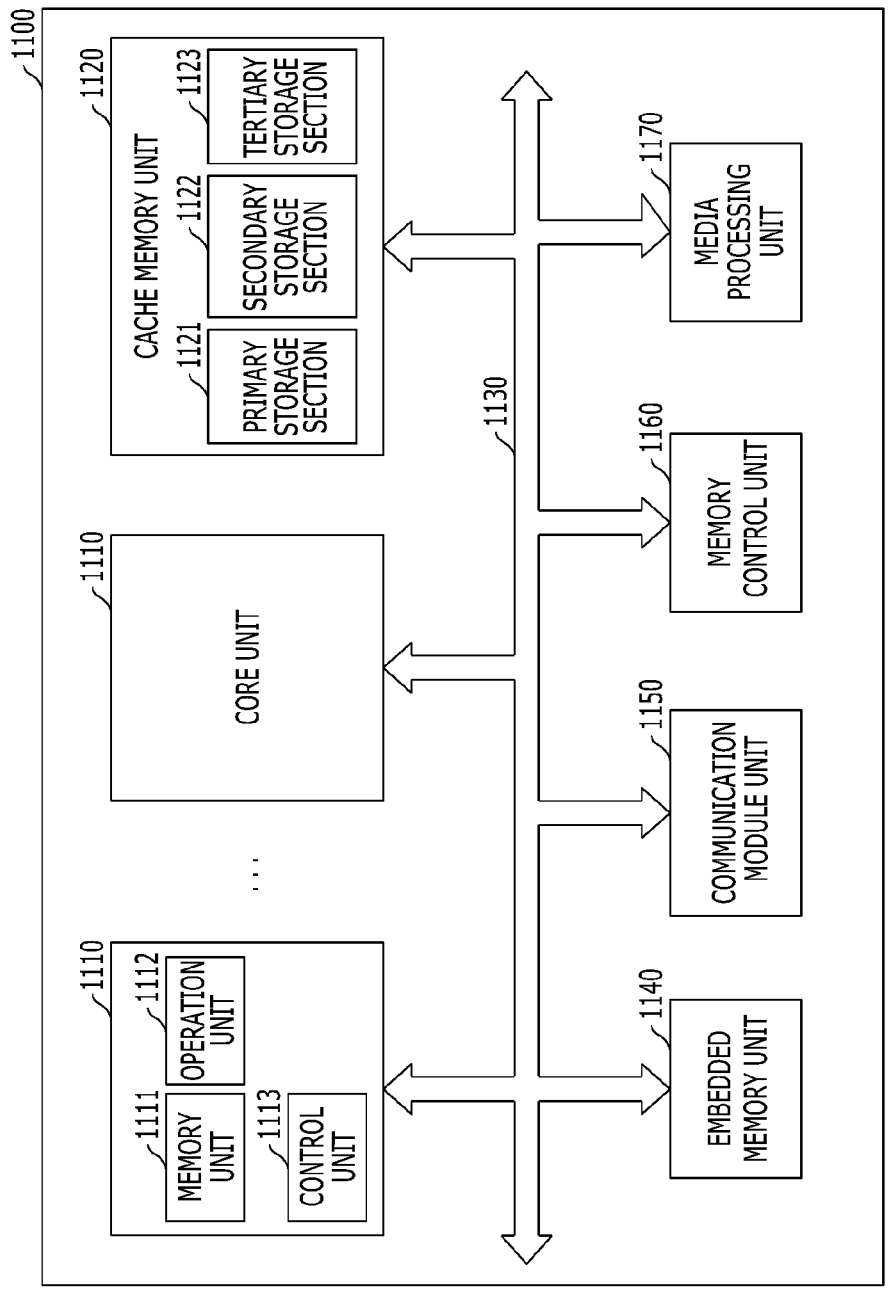
FIG. 3 is an example of configuration diagram of a processor implementing memory circuitry based on the disclosed technology.

FIG. 3 is an example of configuration diagram of a processor implementing memory circuitry based on the disclosed technology.

Referring to FIG. 3, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the cache memory unit 1120 may be improved. As a consequence, operating characteristics of the processor 1100 may be improved.

Although it was shown in FIG. 3 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 4:
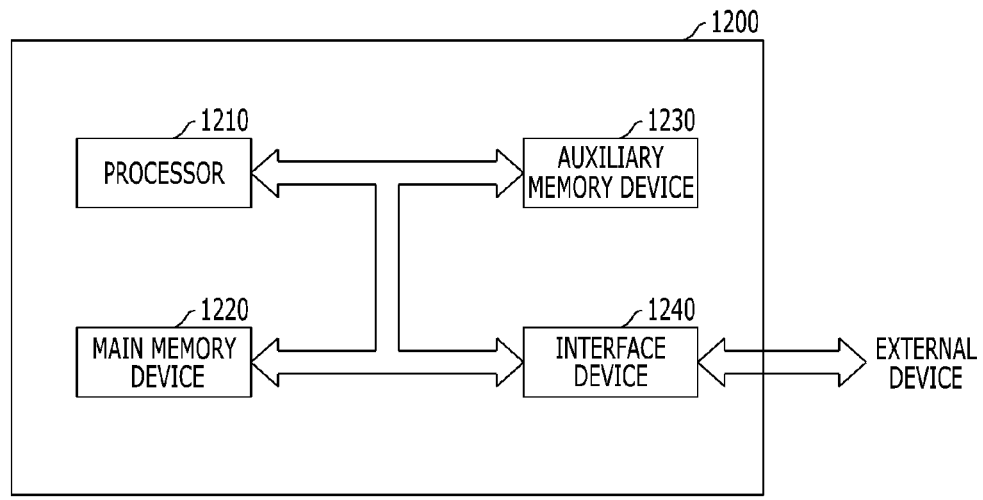
FIG. 4 is an example of configuration diagram of a system implementing memory circuitry based on the disclosed technology.

FIG. 4 is an example of configuration diagram of a system implementing memory circuitry based on the disclosed technology.

Referring to FIG. 4, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 5) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 5:
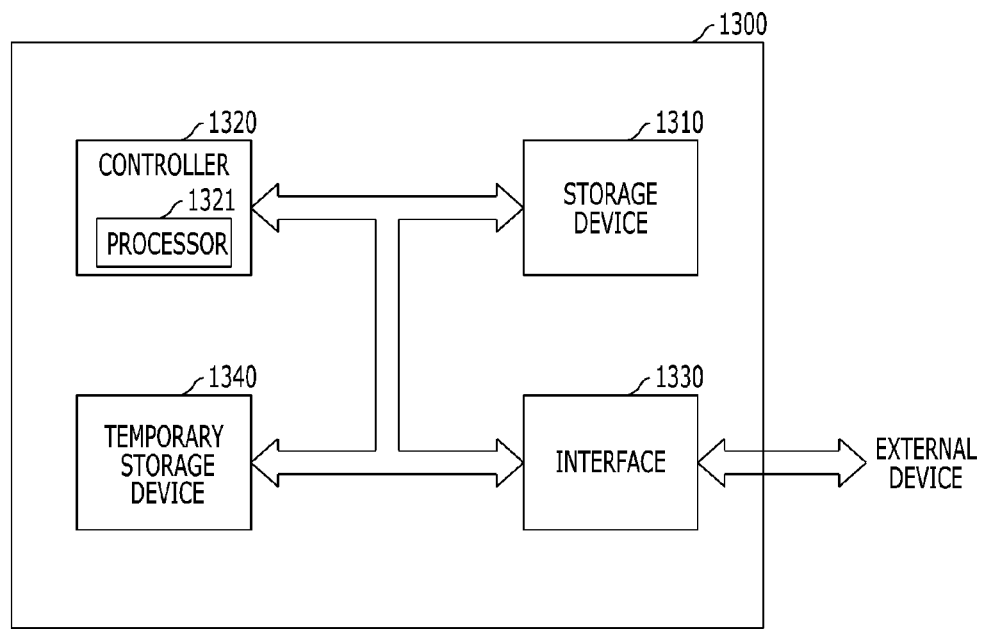
FIG. 5 is an example of configuration diagram of a data storage system implementing memory circuitry based on the disclosed technology.

FIG. 5 is an example of configuration diagram of a data storage system implementing memory circuitry based on the disclosed technology.

Referring to FIG. 5, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the storage device 1310 or the temporary storage device 1340 may be improved. As a consequence, operating characteristics and data storage characteristics of the data storage system 1300 may be improved.

Figure 6:
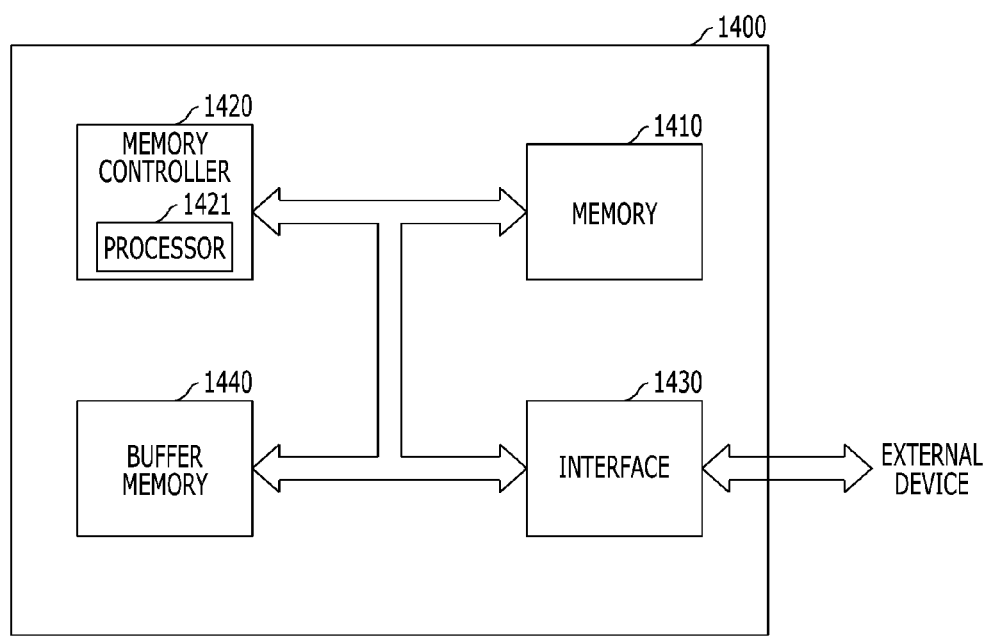
FIG. 6 is an example of configuration diagram of a memory system implementing memory circuitry based on the disclosed technology.

FIG. 6 is an example of configuration diagram of a memory system implementing memory circuitry based on the disclosed technology.

Referring to FIG. 6, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MNIC (eMNIC), a compact flash (CF) card, and so on.

The memory 1410 for storing data may include one or more of the above-described semiconductor devices in accordance with the implementations. For example, the memory 1410 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MNIC (eMNIC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate including a first region and a second region; buried gates formed in the first region and the second region, the buried gates in the second region having a different density distribution from the buried gates in the first region; first and second junction regions formed in the first and second regions, respectively, and having a same depth as each other; and a variable resistance element formed over the substrate and electrically connected to the buried gates in the first region. Through this, the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 2-6 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, the method comprising:
    forming a plurality of buried gates in a substrate including a first region including a cell region that includes storage cells for storing data and a second region including a peripheral region that includes control circuitry to control operations of the storage cells in the cell region, wherein a distance between adjacent buried gates is greater in the second region than in the first region;
    forming an ion implantation barrier layer over the substrate in the second region;
    forming a junction by performing ion implantation into the substrate between the adjacent buried gates in the first and second regions;

removing the ion implantation barrier layer;

forming an interlayer insulating layer over the substrate in the first and second regions;

forming a lower electrode contact through the interlayer insulating layer in the first region so as to contact the substrate; and forming a variable resistance element within a storage cell over the interlayer insulating layer in the first region so as to be connected to the lower electrode contact, wherein the variable resistance element exhibits different resistance states for storing data.

2. The method of claim 1, wherein the ion implantation barrier layer comprises a dielectric material.

3. The method of claim 1, wherein the ion implantation barrier layer comprises oxide.

4. The method of claim 1, further comprising, before the forming of the ion implantation barrier layer over the substrate in the second region, etching the substrate to a predetermined depth.

5. The method of claim 1, wherein the forming of the ion implantation barrier layer over the substrate in the second region comprises:

forming the ion implantation barrier layer over the substrate in the first and second regions;

forming a mask pattern over the ion implantation barrier layer in the second region;

removing the ion implantation barrier layer from the first region; and removing the mask pattern.

6. The method of claim 1, wherein the removing of the ion implantation barrier layer is performed by wet cleaning.

7. The method of claim 1, wherein the forming of the junction comprises performing the ion implantation using an N-type dopant.

8. The method of claim 1, wherein the forming of the junction comprises performing the ion implantation using a dopant comprising arsenic (As) or phosphorus (P).

9. The method of claim 1, wherein the variable resistance element comprises a single-layer or a multi-layer structure.

10. The method of claim 1, wherein the variable resistance element comprises metal oxides including transition metal oxide and perovskite-based oxide, phase-change materials including chalcogenide-based materials, ferroelectric materials, or ferromagnetic materials, or the combination of thereof.

11. The method of claim 1, wherein each of the buried gates comprises a metal gate and a sealing layer.

12. The method of claim 11, wherein the sealing layer comprises nitride.

13. An electronic device including a semiconductor memory which includes:

a substrate including a first region including a cell region that includes storage cells for storing data and a second region including a peripheral region that includes control circuitry to control operations of the storage cells in the cell region;

buried gates formed in the first region and the second region, the buried gates in the second region having a different density distribution from the buried gates in the first region;

first and second junction regions formed in the first and second regions, respectively, and having a same depth as each other; and a variable resistance element formed within a storage cell over the substrate and electrically connected to the buried gates in the first region, wherein the variable resistance element exhibits different resistance states for storing data.

14. The electronic device of claim 13, wherein the buried gates in the second region are further distant from one another than the buried gates in the first region.

15. The electronic device of claim 13, wherein the variable resistance element includes two magnetic layers and a tunnel barrier layer interposed between the two magnetic layers.

16. The electronic device of claim 13, further comprising:

a first wiring electrically connected to the variable resistance element; and a second wiring electrically connected to the second junction region.

17. The electronic device of claim 13, wherein the variable resistance element switches between two different resistance states according to a voltage or current applied to the variable resistance element.

* * * * *